US007362040B2

(12) United States Patent
Neubauer et al.

(10) Patent No.: US 7,362,040 B2
(45) Date of Patent: Apr. 22, 2008

(54) DEVICE FOR OPENING AND CLOSING A MOBILE ELEMENT

(75) Inventors: Achim Neubauer, Sinzheim-Vormberg (DE); Martin-Peter Bolz, Buehl (DE); Jochen Moench, Sinzheim (DE); Falk Herrmann, Fairport, NY (US)

(73) Assignee: Robert Bosch GmbH, Stuttgart (DE)

( * ) Notice: Subject to any disclaimer, the term of this patent is extended or adjusted under 35 U.S.C. 154(b) by 1024 days.

(21) Appl. No.: 10/450,985

(22) PCT Filed: Oct. 8, 2002

(86) PCT No.: PCT/DE02/03480

§ 371 (c)(1),
(2), (4) Date: Nov. 17, 2003

(87) PCT Pub. No.: WO03/038221

PCT Pub. Date: May 8, 2003

(65) Prior Publication Data

US 2004/0070316 A1 Apr. 15, 2004

(30) Foreign Application Priority Data

Oct. 23, 2001 (DE) ................................ 101 51 556

(51) Int. Cl.
*H01L 41/08* (2006.01)

(52) U.S. Cl. ........................................................ 310/800

(58) Field of Classification Search ................ 310/800, 310/330, 339, 345, 328, 338, 326, 286, 256; 318/466–468; *H01L 41/08*
See application file for complete search history.

(56) References Cited

U.S. PATENT DOCUMENTS 4,943,757 A * 7/1990 Richter et al. .............. 318/468
4,963,461 A * 10/1990 Takahashi et al. .......... 430/138
5,051,672 A * 9/1991 Yaguchi ...................... 318/469
5,907,213 A * 5/1999 Oshima et al. ............. 310/328
6,281,455 B1 8/2001 Wilde et al.
6,297,579 B1 10/2001 Henson et al.
6,463,698 B1 10/2002 Hofmann
6,747,399 B1 * 6/2004 Ogino et al. ................ 310/330
2002/0130673 A1 9/2002 Kornbluh et al.

FOREIGN PATENT DOCUMENTS

DE 37 15 871 A 11/1988
GB 2 300 732 A 11/1996

* cited by examiner

*Primary Examiner*—Darren Schuberg
*Assistant Examiner*—Karen Addison
(74) *Attorney, Agent, or Firm*—Michael J. Striker

(57) ABSTRACT

A device for opening and closing an opening (11), in particular in a motor vehicle, by means of a motor-driven, movable part (10), with a control unit (26) and a pinch prevention sensor (14), which is disposed essentially along an edge (20) of the part (10) and/or of a frame profile (12) bordering the opening (11) and which, during the closing of the part (10), detects an obstacle (24) that is in the movement path of the part (10) and sends a signal to the control unit (26) in order to stop or reverse the movement of the part (10), wherein the pinch prevention sensor (14) has a highly elastic, electroactive polymer (EAP) material (30), in particular polyurethane, fluoroelastomer, polybutadiene, fluorosilicone, or silicone, disposed between electrodes (28, 34, 36), which produces a voltage change in the electrodes (28, 34, 36) in the event of a deformation.

23 Claims, 5 Drawing Sheets

DEVICE FOR OPENING AND CLOSING A MOBILE ELEMENT

BACKGROUND OF THE INVENTION

The invention relates to a device for opening and closing a moving component as generically defined by the independent claim.

DE 199 13 106 C1 has disclosed a pinch prevention device with a hollow profile for a force-actuated closing device in which a pinch strip embodied as a hollow profile is disposed along a frame, for example of a sunroof opening. The hollow profile has two electrically conductive regions spaced apart from each other, whose contact triggers a switching action for triggering the motor of the closing device. A hollow profile of this kind is quite expensive to manufacture and when in use, such a system is susceptible to false activations due to a continuous deformation of the electrically conductive regions.

SUMMARY OF THE INVENTION

The device according to the invention with the features of claim 1 has the advantage that even with the exertion of a slight pressure on it, the highly elastic electroactive polymer (EAP) material reliably generates an easily measurable voltage change in the electrodes resting against the EAP material. The design of the pinch prevention sensor is very simple and unsusceptible to malfunction since the system is based on the electroactive material properties of the EAP material. In addition, EAP materials are favorable in terms of their manufacture and processing so that the invention makes it possible to produce an extremely inexpensive and reliable pinch prevention device with a variety of geometric sensor forms.

Advantageous modifications of the device according to the invention are possible by means of the features disclosed in the dependent claims. The electroactive properties of the EAP material are based on an effective extension or alignment of the polymer chains due to a corresponding external deformation of the EAP material. A voltage increase or a voltage decrease is then produced, depending on the force acting on the EAP material and the placement of the electrodes against the EAP material.

It is particularly favorable to form the EAP material into thin layers with a thickness of e.g. 1-100 micrometers since in this instance, particularly with a perpendicular introduction of force onto these layers, the EAP material expands up to 300% even with a slight external force, and therefore a correspondingly significant voltage change is produced. The thin layers can also be placed with particular ease along the edge of the part or the frame profile, for example on or in a sealing lip.

A voltage change according to the following formula is characteristic for EAP materials:

$$U=t^{*}\cdot(p/\epsilon r^{*}\epsilon 0).$$

The order of magnitude of the voltage change can therefore be predetermined in a particularly advantageous manner through the selection of the thickness t of the EAP materials.

If several EAP layers, each equipped with electrodes, are disposed one over another and connected in quasi-series, then the individual voltage changes are added up, which permits a simpler signal evaluation due to the more powerful measurement signal.

It is advantageous to dispose the at least one EAP layer approximately perpendicular to the expected pinching force since this would produce the greatest possible material deformation and therefore a maximal voltage change.

Alternatively, however, devices are also conceivable in which a number of EAP layers are disposed approximately parallel to the movement plane of the part. The pinching force then acts approximately parallel to the EAP layers and changes their superficial extent, which is correlated with a change in the thickness of the layers. The electrodes in this case can be disposed both between the EAP layers and at the ends of the EAP layers.

If one or more EAP layers—optionally also with insulation layers disposed between them—are rolled into a roll, then this apparatus can detect all forces in the plane perpendicular to the roll in the same way. A roll of this kind can therefore be placed in a particularly advantageous fashion along the seal of a frame.

With such a placement of the roll approximately parallel to the edge of the part or the frame, the electrodes are favorably embodied as layers between the rolled EAP layers. Alternatively, however, the electrodes can also be placed at the ends of such a roll or tube; this is particularly advantageous for a division of the pinch prevention sensor along the edge or frame profile in order to be able to detect an obstacle in a manner that is broken down by location.

It is advantageous to place the at least one EAP layer directly on top of or under a perforated band matrix. This matrix establishes spatially fixed support points; the EAP layer bulges through the openings in the perforated band matrix in response to the application of a fundamental voltage. This assures that even relatively small obstacles cause a sufficient deformation of the EAP layer to occur since with this apparatus, a local introduction of force cannot be equalized over a large region of the EAP layer.

In order to produce a spatially flexible and therefore also locally sensitive pinch prevention sensor, at least one of the electrodes is three-dimensionally patterned. In this connection, it is particularly advantageous if the electrode has a high degree of flexibility along the edge of the part or the frame because this results in the reliable detection of even smaller obstacles.

If the at least one electrode of the at least one EAP layer is divided into a number of electrodes that are insulated from one another, then this makes it easy to achieve a sensor that is broken down by location, in particular along the edge of the part or the frame.

It is advantageous here if two polymer films are coated so that the patterned electrodes are enclosed in the middle. This assures that the effective electrode surfaces are disposed directly on top of one another without adjustment. Integrating the typically very narrow strip conductors into the sensor also protects them mechanically.

In order to assure an uninterrupted sensing of an obstacle, the different independent sensors can overlap one another spatially, in particular along the edge or frame. If each independent sensor region has its own electrode, then a matched, predetermined fundamental voltage can be applied in order to adjust the sensitivity of the sensor individually by location.

It is particularly advantageous to place the pinch prevention sensor between the sealing profile and the frame profile of an opening. In this case, the sensor can be glued in place or simply clamped in place, without requiring a structural change to the existing sealing profile or frame profile.

The spatially divided electrodes can be produced in a particularly advantageous manner by means of a printed circuit board technique in which the individual electrodes—with their strip conductors that lead to the voltage tap embodied in the form of a thin layer—are disposed on a thin, flexible printed circuit board film.

The two-sided use of the sensor top and sensor bottom for the routing of strip conductors permits a particularly space-saving design of the sensor.

From a production engineering standpoint, it is favorable to attach the pinch prevention sensor to the frame profile or sealing profile with a foil, where the strip conductors for the connections of the electrodes are preferably disposed on the foil. This method permits a fine spatial division of the sensor into regions with independent electrode pairs.

Since the EAP materials have properties very similar to those of sealing profile materials, it is possible to integrate the EAP layers in a particularly advantageous manner into the sealing profile and to produce them in a single step along with this profile, for example by means of coextrusion or multi-component injection molding.

Attaching the EAP layer to the sealing profile in the form of a lacquer or by means of gluing is also an inexpensive alternative. Because of the rubber-like properties of EAP materials, pinch prevention sensors produced in this manner are also very durable in relation to mechanical stress, even over a large temperature range of −50° C. to 200° C.

The fact that the at least one EAP layer is disposed in a semicircle around the one end of the frame profile also makes it possible to reliably sense pinching forces acting on the sealing profile outside the movement plane of the part.

The fact that the pinch prevention sensor is broken down spatially along the edge or frame makes it easy to preset regions with different sensitivities that are adapted to the particular edge sections of the part. It is thus possible to take into account the geometric form of the part and of the corresponding frame, which geometric forms generate pinching force components that diverge from the closing direction.

The sensitivity of the individual sensor regions can be advantageously realized by applying an individually adapted working voltage to the electrodes of the corresponding regions. Since the voltages applied to EAP materials are typically in the kV range, the signals of the electrodes are supplied to a d.c./d.c. converter, which is part of an evaluation device in a control unit of the pinch prevention sensor.

BRIEF DESCRIPTION OF THE DRAWINGS

Exemplary embodiments of a device according to the invention are depicted in the drawings.

DESCRIPTION OF THE PREFERRED EMBODIMENTS

Figure 1:
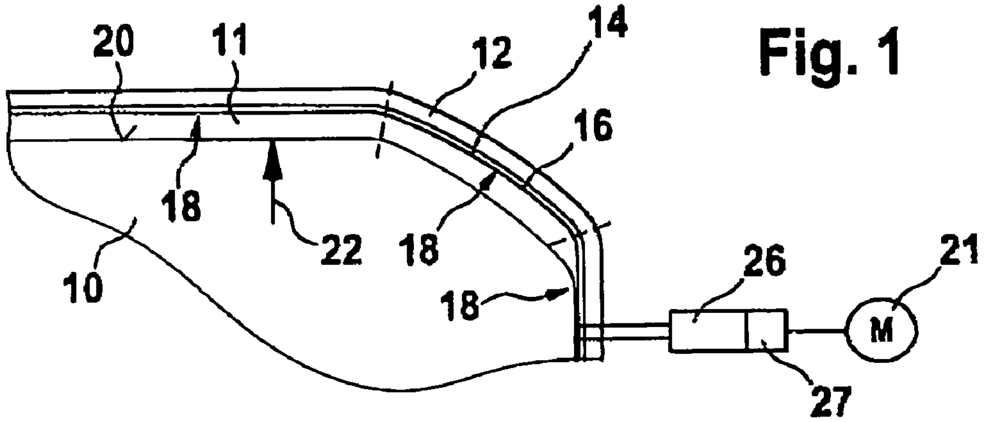
FIG. 1 shows the placement of a pinch prevention sensor on a motor vehicle side window.

FIG. 1 shows a side window of a motor vehicle, in which a pinch prevention sensor 14 is disposed along the entire length of a frame profile 12 encompassing a window opening 11, between this frame profile 12 and a window 10 that represents the moving part 10 in this instance. The pinch prevention sensor 14 is integrated, for example, into a sealing profile 16 and is divided into various regions 18 that correspond to the shape of the window. The window 10 has an edge 20, which extends essentially parallel to the frame profile 12. When the part 10 is closed, a closing force 22 occurs, whose components perpendicular to the edge 20 of the part 10 can be of different magnitudes in the different regions 18. If an obstacle 24 lies in the movement path between the part 10 and the frame profile 12, then a pressure is exerted on the pinch prevention sensor 14 during closing, and a signal is sent to a control unit 26 of the closing device. If a predetermined threshold value of the closing force 22 is exceeded, then the motor 21 receives a control command to stop the part 10 or to reverse its movement direction.

Figure 2A:
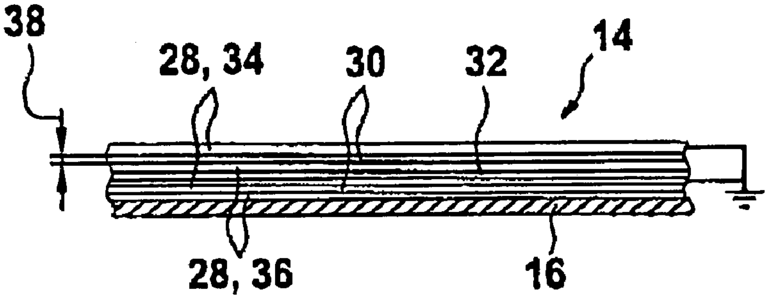
FIGS. 2*a* to 2*c* show the functional principles of the device according to the invention.
Figure 2B:
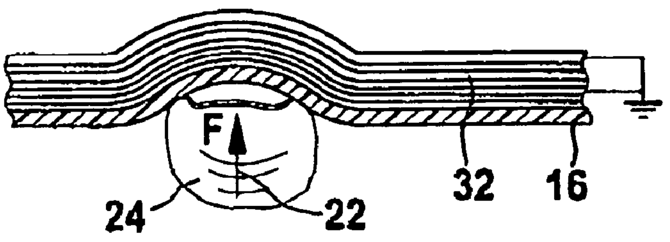
Figure 2C:
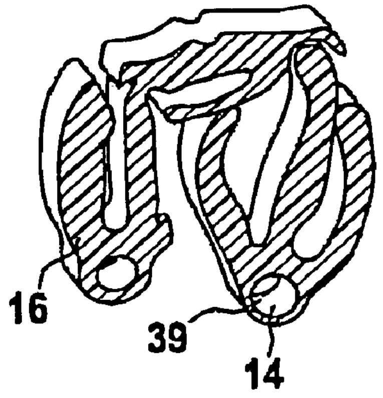

FIGS. 2*a* to 2*c* show schematic cross sections through a pinch prevention sensor 14, which has a number of electroactive polymer EAP layers. For example, polyurethane PT6100S, fluoroelastomer Lauren L143HC, polybutadiene Aldrich PBD, fluorosilicone 730, or silicone Sylgard 186 are used as the EAP material. EAP materials have the particular property that due to their electrostriction, when there is an external deformation, the effective length of the electroactive, dielectric polymer chains changes. This length change produces a voltage change in the electrodes 28 placed against the EAP layers. In FIG. 2*a*, a first EAP layer 30 between two electrode layers 28 is disposed on a rubber of a sealing profile 16. On top of this first electrode/EAP packet, separated by means of an insulation layer 32, there is another layer sequence of electrode, EAP layer, and electrode. The two electrodes 34 are connected to ground and a positive voltage is respectively applied to the two other electrodes 36. The thickness 38 of the EAP layer 30 is between 1 and 100 micrometers, for example. The thinner this layer is, the more it can be stretched, which increases the sensitivity of the pinch prevention.

FIG. 2*b* shows the deforming of the EAP layers 30 due to a pinched obstacle 24. The pinching force 22 causes the EAP layers 30 to lengthen along the sealing profile 16. As a result, the EAP layers 30 experience a lateral contraction, which reduces their thickness 38. This leads to a voltage change between the two electrode pairs 34, 36, which corresponds to a particular introduction of force onto the pinch prevention sensor 14. The voltage change is measured in the control unit 26 and compared to a limit value; if the voltage exceeds or falls below this limit value, then the motor 21 is stopped or reversed. The voltage change is produced according to the following formula $$U=t*\sqrt{(p/\epsilon r*\epsilon 0)},$$

where the voltage change produced is directly proportional to t, which is the thickness 38 of the EAP layer 30. The pressure P generated by the pinching force 22 of an obstacle 24 and the dielectric material properties $\epsilon_r$ and $\epsilon_0$ influence the voltage change only as factors under the radical.

FIG. 2*c* shows the pinch prevention sensor 14 in a cavity 39 of the sealing profile 16, which extends approximately parallel to the edge 20.

Figure 3:
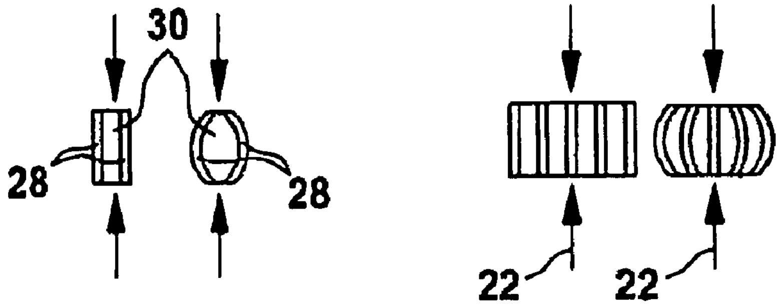
FIG. 3 and FIGS. 4*a* to 4*c* show different exemplary embodiments of a pinch prevention sensor according to the invention.

FIG. 3 shows an alternative embodiment of the pinch prevention sensor 14. Here, too, an EAP layer 30 is disposed between two flat electrodes 28; in the picture on the right, four EAP layers 30 with interposed electrodes 28 are combined to form a packet. But the closing force 22 here does not act perpendicular to the EAP layers 30 and electrodes 28, but in the layer plane of the EAP layers 30. This introduction of force likewise produces a shape change in the EAP layers 30, which causes them to thicken.

A voltage change is also picked up in the electrodes 28 disposed between the EAP layers 30, which is correlated with the closing force 22. In this embodiment of a pinch prevention sensor 14, the EAP layers 30 are disposed between the frame profile 12 and the window 10, approximately parallel to its movement direction. When a number of EAP layers 30 are used, the fact that the individual voltage changes are added together boosts the measurement signal.

In another exemplary embodiment according to FIG. 4, a layer sequence of electrode 28, EAP layer 30, electrode 28, EAP layer 30 is rolled onto a rolling core 40 to form a roll 42 extending axially, approximately parallel to the edge 20. When the part 10 is being closed, the pinch prevention sensor 14 experiences a radial force introduction as soon as an obstacle 24 presses against it. The EAP layers 30—at least the layers perpendicular to the closing force—are compressed in such a way that the thickness 38 of the EAP layers 30 is reduced. This likewise leads to an additive voltage change that is picked up in the two electrodes 28.

Figure 4A:
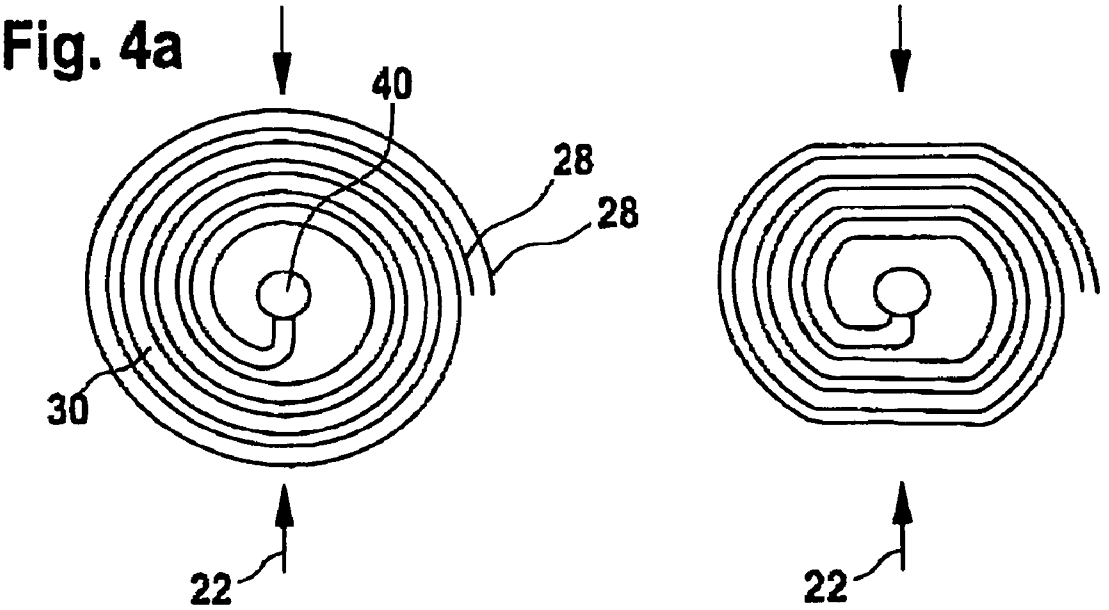
Figure 4B:
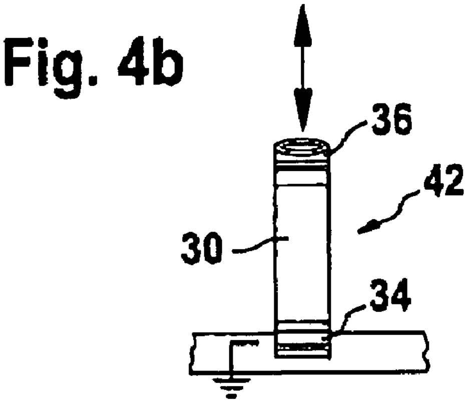

FIG. 4*b* shows an EAP layer 30 that also has interposed electrodes 34, 36, rolled up in a manner analogous to FIG. 4*a*, but in this apparatus, the force is introduced in the axial direction in relation to the roll 42. In this instance, a number of rolls 42 are disposed with their axes approximately in the plane of the window and approximately perpendicular to the edge 20; an axial length change of the roll 42 produces a change—in this case an increase—in the thickness 38 of the EAP layers 30.

Figure 4C:
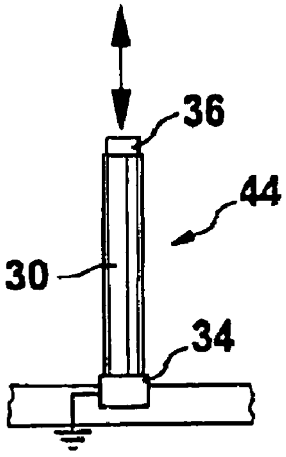

FIG. 4*c* shows another variation in which the EAP layer 30 is embodied as a single-layer tube 44 with the electrodes 34, 36 disposed at each of the two axial ends of the tube 44. The force here is also introduced axially in accordance with FIG. 4*b*, which likewise changes the thickness 38 of the EAP layer 30. The electrode apparatus here does not measure the voltage change by means of the thickness 38 of the EAP layer 30, but rather by means of its axial size.

Figure 5:
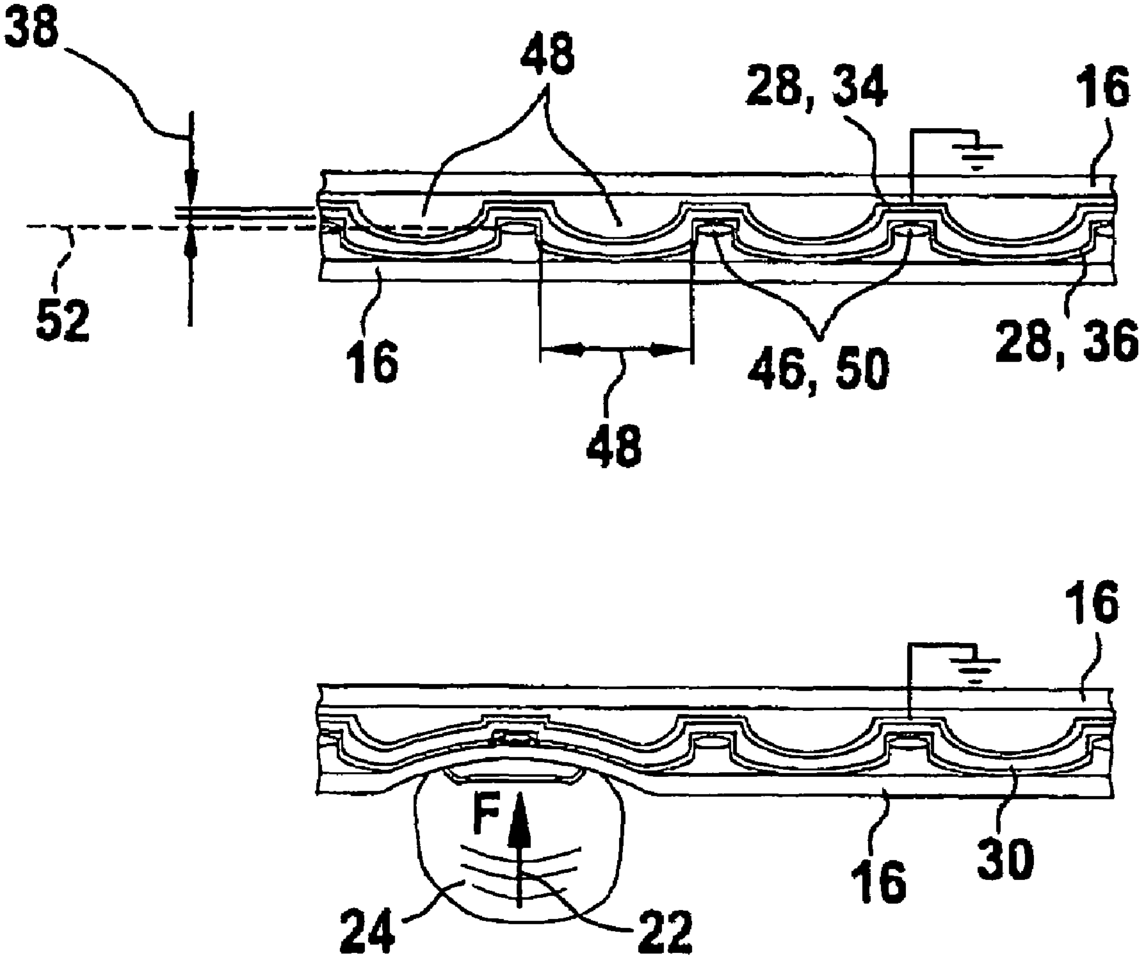
FIG. 5 shows another exemplary embodiment with a perforated band matrix.

FIG. 5 shows another embodiment of the pinch prevention sensor 14 according to the apparatus in FIG. 2. Here, an EAP layer 30 embedded between two electrodes 34, 36 is placed over a perforated band matrix 46. Between the individual openings 48 of the perforated band matrix 46 extending approximately parallel to the edge 20, there are support points 50 on which the EAP layer 30 is suspended. The perforated band matrix 46 is a spatially fixed frame; the EAP layer 30, together with the electrodes 34, 36, expands through the holes 48 of this matrix when a voltage is applied to the electrodes 34, 36. The perforated band matrix 46, together with the electrodes 34, 36 and the EAP layer 30, is integrated into a sealing profile 16 or is directly manufactured in one piece with it by means of multi-component injection molding. Due to the presence of the spatially fixed support points 50, even small obstacles 24 produce a relatively powerful deformation of the EAP layer 30, since this layer is forced back through the openings 48 to the plane 52 of the perforated band matrix 46. This generates a voltage change between the contacting electrodes 34, 36 that is evaluated in order to trigger the pinch prevention function.

Figure 6:
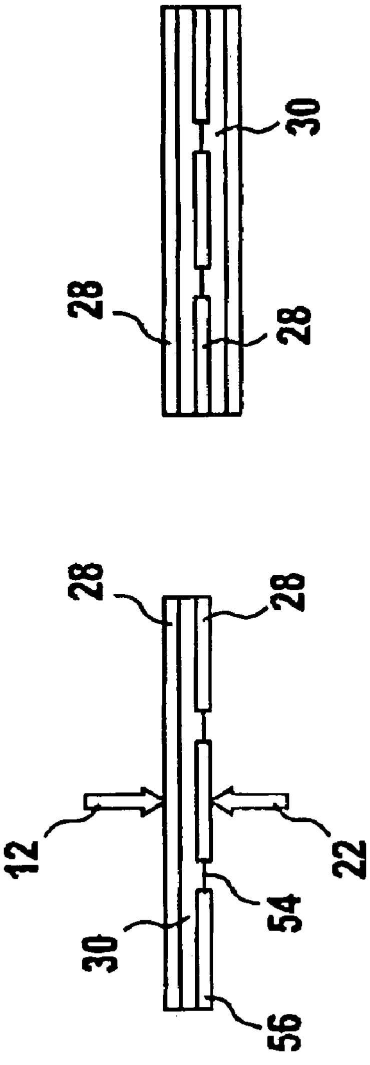
FIGS. 6 and 7 show different embodiments of electrodes of a device according to the invention.

FIG. 6 shows a pinch prevention sensor 14, first with one and then with two EAP layers 30, each embodiment having a patterned electrode 56. The electrode 56 is divided into small sections along the edge 20 or the frame profile 16, which sections are connected to one another by means of flexible connecting pieces 54. The patterned electrode 56 is embodied as an integrated layer and can have various geometrical forms. An electrode 56 of this kind, which is disposed on or between EAP layers, is very flexible and extremely elastic and therefore wear resistant, even in a one-piece design.

Figure 7:
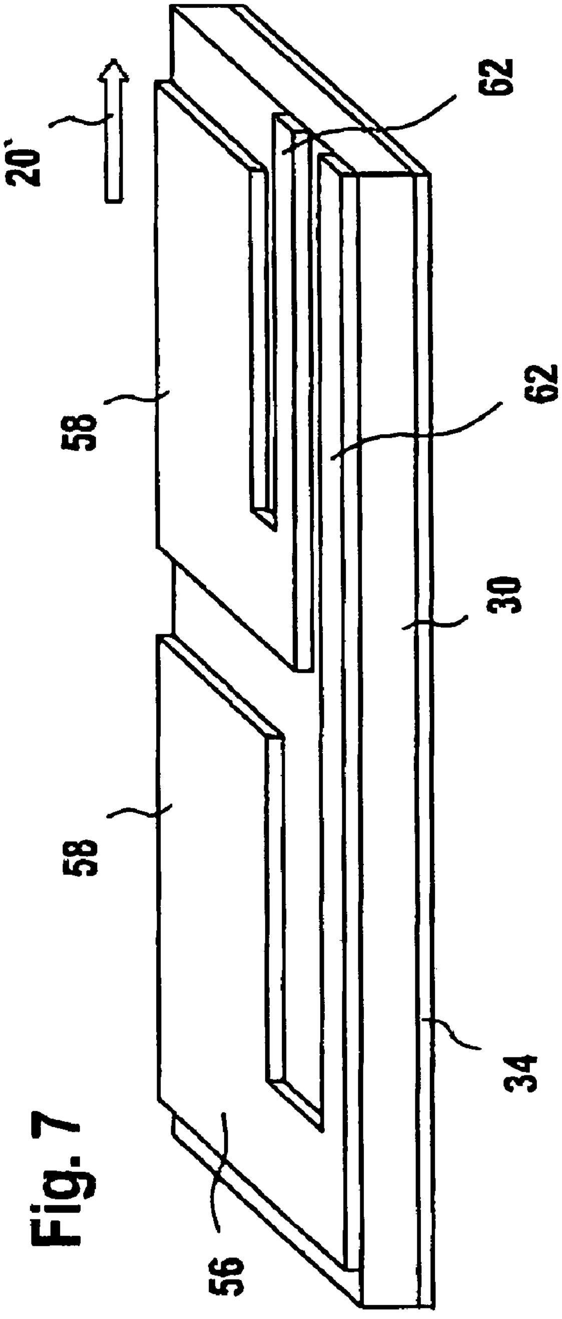

FIG. 7 shows an exemplary embodiment of a sensor 14 with a one-piece, unpatterned base electrode 34 with an EAP layer 30 disposed on top of it. A patterned electrode 56 is in turn placed onto this EAP layer 30 in the form of an integrated layer in which the individual electrode sections 58 are insulated from one another. The individual electrode sections 58 have strip conductors 62 for contacting, which are also components of the integrated layer. The electrode sections 58 are preferably subdivided in the direction 20' of the edge 20 in order to locally increase the sensitivity of the pinch prevention sensor 14 or also to create a subdivision into regions 18 that correspond to the window contour according to FIG. 1. If the base electrode 34 is connected to ground, then each individual electrode section 58 can be associated with a fundamental voltage that is individual to each electrode section 58—or is individual to each of the sensor regions 18. This allows a different sensitivity of the sensor 14 to be set for each section 58 or region 18. Alternatively, such a local sensitivity can also be set by means of different threshold values of the voltage change.

Figure 8:
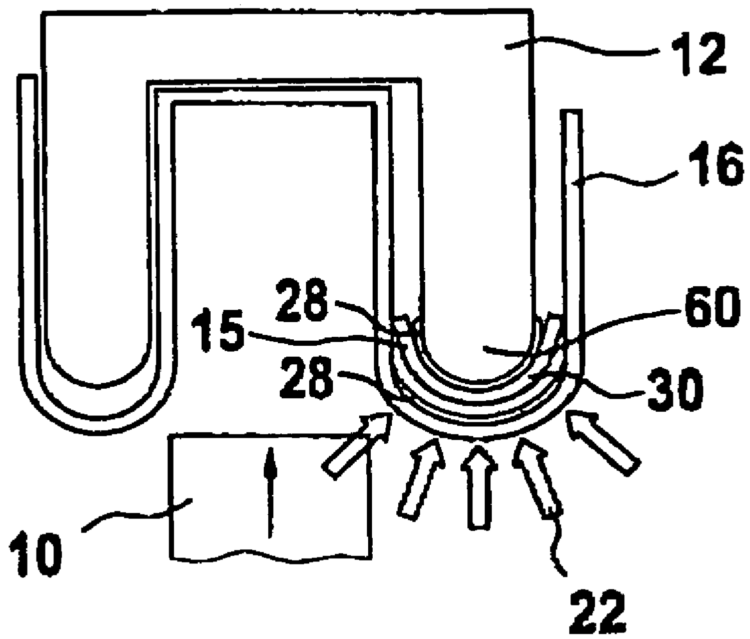
FIGS. 8 and 9 show other possible placements of the pinch prevention sensor in a frame profile according to FIG. 1.

FIG. 8 shows a cross section through a frame profile 12 with a sealing profile 16. The EAP layer 30 disposed between two electrode layers 28 is arranged in a circular curve around a free end 60 of the frame profile 12, between this frame profile 12 and the sealing profile 16. The semicircular design of the pinch prevention sensor 14 in a plane approximately perpendicular to the edge 20 makes it possible to also detect clamping forces 22 that lie outside the movement plane of the part 10; primarily the inner region 15 of the pinch prevention sensor 14 oriented toward the window 10 is decisive for the timely detection of an obstacle 24. The pinch prevention sensor 14 in this apparatus is glued to the free end 60 of the sealing profile 12, but can also be merely inserted into the sealing profile 16 and pressed against the free end 60 before the sealing profile 16 is installed.

Figure 9:
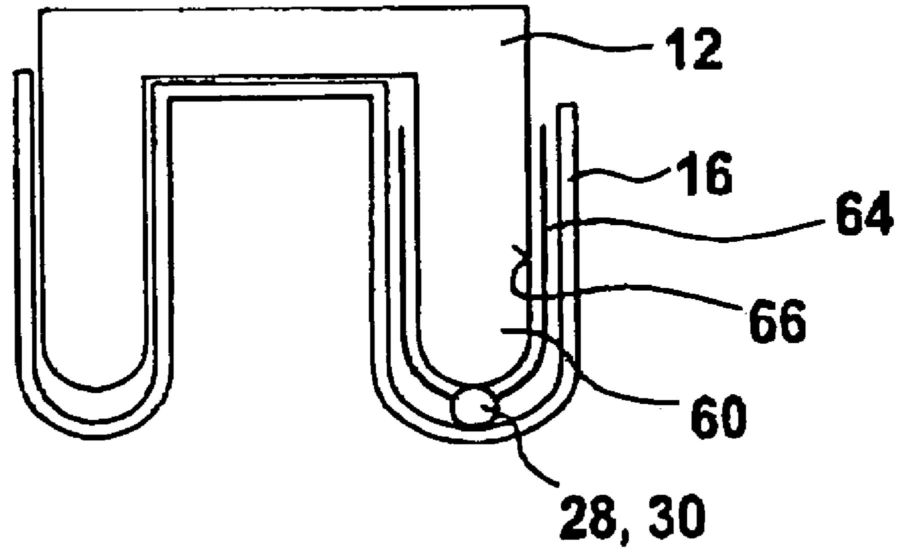

FIG. 9 shows the pinch prevention sensor 14 affixed to a free end 60 of the frame profile 12 by means of a foil 64, which supports the strip conductors 62 for the individual electrode sections 58. If the entire length of the pinch prevention sensor 14 is subdivided into a number of sections 58, then for the multitude of electrode connections, a large area is required to route the strip conductors 62 along the frame profile 12 to a voltage source. This purpose is served by the flexible printed circuit board foil 64, which extends over the entire region between the outside 66 of the sealing profile 12 and the sealing profile 16. The EAP layers 30 and the associated electrodes 28 here are preferably integral components of the printed circuit board foil 64. The printed circuit board foil 64 with the strip conductors 62 is either glued to the sealing profile 16 or is merely pressed between the sealing profile 16 and the frame profile 12. The contact strips 62 are preferably routed to a control unit 26 in which the applied voltages in the kV range are transformed by means of a d.c./d.c. converter for further processing in the evaluation electronics. The electrodes 28 carry currents on the order of magnitude of 0.5 mA so that even high voltages present no danger to humans. The local length change of the EAP layer 30 by up to 300% occurs in accordance with the closing speed of the part 10. The reaction time of the electrostriction, i.e. the generation of a voltage change when a working voltage is applied, occurs in the range from milliseconds to microseconds. The model of a capacitor can also be used to describe the electrostriction, in that the EAP material is disposed as a dielectric between two flat electrode plates. The external deformation causes impedance changes in the system since the effective length of the polymer chains or the orientation of the inner dipoles in the applied electrical field changes. The multiple EAP layers stacked on top of one another can be connected in quasi-series in order to boost the measurement signal. The thinner the EAP films can be applied, the lower the current losses due to heat emission of the electrodes. The fact that the patterned electrode 56 is enclosed between two EAP layers assures that the effective electrode surfaces are disposed directly on top of one another without requiring adjustment. Integrating the typically very narrow strip conductors 62 into the sensor also protects them mechanically. In the production of the EAP layers 30, care must be taken to give them a homogeneous layer thickness 38 since otherwise a constant, homogeneous electrical field cannot be applied. The fact that the sensor material has mechanical properties very similar to those of the material of the sealing profile 16 minimizes the occurrence of delamination between the sensor 14 and the rubber. This applies to a temperature range from −50 to 200° C., which fully covers applications in the motor vehicle field. The design of the pinch prevention sensor 14 according to the invention can therefore also be simply applied to the sealing profile 16 in the form of a lacquer.

It is also conceivable to draw conclusions, for example as to the size of the pinched object 24, from the course of the impedance changes and to consequently also to determine the triggering threshold value depending on the size of the object.

The invention claimed is:

1. A device for opening and closing an opening (11) in a motor vehicle, by means of a motor-driven, movable part (10), with a control unit (26) and a pinch prevention sensor (14), which is disposed essentially along an edge (20) of the part (10) and/or of a frame profile (12) bordering the opening (11) and which, during the closing of the part (10), detects an obstacle (24) that is in the movement path of the part (10) and sends a signal to the control unit (26) in order to stop or reverse the movement of the part (10), wherein the pinch prevention sensor (14) has a highly elastic, electroactive polymer (EAR) material (30) disposed between electrodes (28, 34, 36), which produces a voltage change in the electrodes (28, 34, 36) in the event of a deformation, wherein a voltage U according to the formula $U=t^{*}(p/\epsilon_r{}^{*}\epsilon_0)$ ½ occurs in the electrodes (28, 34, 36), where t is the thickness (38) of the EAR layer (30), $\epsilon_r$ is the specific inductive capacity, $\epsilon_0$ is the electric constant, and P is the pressure on the EAP layer (30) generated by the obstacle (24).

2. A device for opening and closing an opening (11) in a motor vehicle, by means of a motor-driven, movable part (10), with a control unit (26) and a pinch prevention sensor (14), which is disposed essentially along an edge (20) of the part (10) and/or of a frame profile (12) bordering the opening (11) and which, during the closing of the part (10), detects an obstacle (24) that is in the movement path of the part (10) and sends a signal to the control unit (26) in order to stop or reverse the movement of the part (10), wherein the pinch prevention sensor (14) has a highly elastic, electroactive polymer (EAR) material (30) disposed between electrodes (28, 34, 36), which produces a voltage change in the electrodes (25, 34, 36) in the event of a deformation, wherein the at least one EAP layer (30) is disposed on top of a perforated band matrix (46) and expands through the openings (48) of the perforated band matrix (46) when a voltage is applied to the electrodes (28, 34, 36).

3. A device for opening and closing an opening (11) in a motor vehicle, by means of a motor-driven, movable part (10), with a control unit (26) and a pinch prevention sensor (14), which is disposed essentially along an edge (20) of the part (10) and/or of a frame profile (12) bordering the opening (11) and which, during the closing of the part (10), detects an obstacle (24) that is in the movement path of the part (10) and sends a signal to the control unit (26) in order to stop or reverse the movement of the part (10), wherein the pinch prevention sensor (14) has a highly elastic, electroactive polymer (EAR) material (30) disposed between electrodes (28, 34, 36), which produces a voltage change in the electrodes (28, 34, 36) in the event of a deformation, wherein the at least one of the electrodes (28, 34, 36, 56) is three-dimensionally patterned, and in particular, is embodied so that it can move slightly in the direction (20') of the edge (20).

4. A device for opening and closing an opening (11) in a motor vehicle, by means of a motor-driven, movable part (10), with a control unit (26) and a pinch prevention sensor (14), which is disposed essentially along an edge (20) of the part (10) and/or of a frame profile (12) bordering the opening (11) and which, during the closing of the part (10), detects an obstacle (24) that is in the movement path of the part (10) and sends a signal to the control unit (26) in order to stop or reverse the movement of the part (10), wherein the pinch prevention sensor (14) has a highly elastic disposed between electrodes (28, 34, 36), which produces a voltage change in the electrodes (28, 34, 36) in the event of a deformation, wherein the pinch prevention sensor (14) is fixed by means of a foil (64) that supports strip conductors (62) for controlling the electrodes (28, 34, 36, 56).

5. The device according to claim 1, wherein the electroactive polymer (EAR) material (30) is a material selected from the group consisting of polyurethane, fluoroelastomer, polybutadiene, fluorosilicone, or silicone.

6. The device according to claim 1, wherein when the EAR material (30) is deformed, the effective length of its polymer chains changes.

7. The device according to claim 1, wherein the EAR material (30) is formed into thin layers, in particular from 1 to 100 um in thickness (38).

8. The device according to claim 1, wherein a number of EAP layers (30) with electrodes (28, 34, 36) and/or insulation layers (32) disposed between them are stacked one on top of another.

9. The device according to claim 1, wherein the pressure generated by the obstacle (24) acts predominantly perpendicular to the EAP layers (30).

10. The device according to claim 1, wherein the pressure generated by the obstacle (24) acts predominantly parallel to the EAP layers (30).

11. The device according to claim 1, wherein the at least one EAP layer (30) is formed into a tube (44) or a roll (42).

12. The device according to claim 1, the electrodes (28, 34, 36) are disposed on the ends or on the circumference surfaces of the tube (42) or the roll (44).

13. The device according to claim 1, wherein the pinch prevention sensor (14) is subdivided into a number of independent regions (18, 58) along the edge (20) or the frame profile (12).

14. The device according to claim 1, wherein the regions (18, 58) of the pinch prevention sensor (14) overlap.

15. The device according to claim 1, wherein each sensor region (18, 58) has at least one separate electrode (28, 34, 36, 56).

16. The device according to claim 1, wherein the individual electrodes (28, 34, 36, 56) of the sensor regions (18, 58) are embodied in the form of an integrated layer with strip conductors (62) on the EAR layer (30).

17. The device according to claim 1, wherein the pinch prevention sensor (14) is disposed between a frame profile (12) enclosing the part (10), and a sealing profile (16) inserted into this frame profile (12).

18. The device according to claim 1, wherein the pinch prevention sensor (14) is integrated into the sealing profile (16) embodied of one piece with the sealing profile (16) by means of coextrusion or multi-component injection molding.

19. The device according to claim 1, wherein the at least one EAP layer (30) is disposed in the sealing profile (16) in the form of a lacquer or is glued to the sealing profile (16).

20. The device according to claim 1, wherein the pinch prevention sensor (14) is embodied so that it extends in a semicircular form around at least one free end (60) of the frame profile (12) oriented toward the part (10).

21. The device according to claim 1, wherein the pinch prevention sensor (14) is subdivided into regions (18, 58) of different sensitivities along the edge (20) or the frame profile (12), each of which regions is associated with a threshold value of the voltage change that is adapted to the geometry of the edge (20), and triggers a stopping or reversing of the part (10) when the voltage change exceeds or falls below this threshold value.

22. The device according to claim 1, wherein different output voltages are applied to the electrodes (28, 34, 36, 58) associated with the individual EAR layers (30) or sensor regions (18, 58).

23. The device according to claim 1, wherein the pinch prevention sensor (14) has a d.c./d.c. converter (27) for the evaluation of the voltage change in the control unit (26).

* * * * *